(12) United States Patent
Huang

(10) Patent No.: US 9,728,253 B2
(45) Date of Patent: Aug. 8, 2017

(54) SENSE CIRCUIT FOR RRAM

(71) Applicant: Winbond Electronics Corp., Taichung (TW)

(72) Inventor: Koying Huang, San Jose, CA (US)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/953,866

(22) Filed: Nov. 30, 2015

(65) Prior Publication Data

US 2017/0154674 A1     Jun. 1, 2017

(51) Int. Cl.
*G11C 13/00*          (2006.01)

(52) U.S. Cl.
CPC ........ *G11C 13/004* (2013.01); *G11C 13/0023* (2013.01); *G11C 13/0097* (2013.01)

(58) Field of Classification Search
CPC .............. G11C 13/004; G11C 13/0023; G11C 13/0097
USPC .......................................................... 365/148
See application file for complete search history.

(56) References Cited

U.S. PATENT DOCUMENTS

| 8,203,863 | B2 * | 6/2012 | Kim ........................ G11C 5/063 365/148 |
| 8,274,842 | B1 | 9/2012 | Hollmer et al. |
| 2002/0154531 | A1 | 10/2002 | Lowrey et al. |
| 2005/0045919 | A1 | 3/2005 | Kaeriyama et al. |
| 2007/0206403 | A1 * | 9/2007 | Shirahama ............. G11C 5/148 365/148 |
| 2010/0067285 | A1 * | 3/2010 | Lung .................... G11C 11/5664 365/163 |
| 2010/0271861 | A1 | 10/2010 | Kitagawa |
| 2011/0051496 | A1 * | 3/2011 | Chi ..................... G11C 13/0007 365/148 |
| 2014/0036596 | A1 * | 2/2014 | Chan .................... G11C 11/5642 365/185.21 |
| 2014/0254238 | A1 * | 9/2014 | Gilbert ................. G11C 13/004 365/148 |

\* cited by examiner

*Primary Examiner* — Huan Hoang
*Assistant Examiner* — Muna A Techane
(74) *Attorney, Agent, or Firm* — Muncy, Geissler, Olds & Lowe, P.C.

(57) ABSTRACT

A resistive random-access memory device includes a RRAM array including a plurality of RRAM cells coupled to a source line, a controller, a bit-line decoder, and a sense circuit. Each of the RRAM cells storing a logic state and is selected by the corresponding bit line and word line. The controller selects a selected RRAM cell by a bit-line signal and a selected word line and determines the logic state according to a sense signal. The bit-line decoder couples a data bit line to the selected bit line according to a bit-line signal. The sense circuit is coupled to the data bit line and compares a memory current flowing through the selected RRAM with a reference current to generate the sense signal. The sense circuit sinks the memory current from the data bit line when operating in a reset operation and a reverse read operation.

18 Claims, 5 Drawing Sheets

SENSE CIRCUIT FOR RRAM

BACKGROUND OF THE INVENTION

Field of the Invention

The disclosure relates generally to sense circuits for RRAM, and more particularly it relates to sense circuits for efficiently reading and writing a RRAM cell.

Description of the Related Art

Recently, new nonvolatile memory devices, such as a resistance random access memory (RRAM), have been proposed. A unit cell of the RRAM includes a data storage element which has two electrodes and a variable resistive material layer interposed between the two electrodes. The variable resistive material layer, i.e., a data storage material layer, has a reversible variation in resistance according to whether a filament, a conductive path or a low resistive path is formed through the resistive material layer by the electrical signal (voltage or current) applied between the electrodes.

The read operation of a RRAM device includes two opposite operations, i.e., the forward read operation and the reverse read operation, and the sense circuit of the RRAM device should be switched between the bit line and the source line for either read operation. In order to simplify the operation of the sense circuit in the forward read operation and the reverse read operation, we need an efficient sense circuit to read the logic state of a RRAM cell.

BRIEF SUMMARY OF THE INVENTION

For solving above problems, the invention provides a sense circuit to efficiently read and write the logic state of a RRAM cell.

In an embodiment, a resistive random-access memory device includes a RRAM array, a controller, a bit-line decoder, and a sense circuit. The RRAM array includes a plurality of RRAM cells coupled to a source line. Each of the RRAM cells stores a logic state and is selected by a corresponding bit line and a corresponding word line. The controller selects a selected RRAM cell by a bit-line signal and a selected word line. The controller determines the logic state stored in the selected RRAM cell according to a sense signal. The bit-line decoder couples a data bit line to the selected bit line according to a bit-line signal. The sense circuit is coupled to the data bit line and compares a memory current flowing through the selected RRAM with a reference current to generate the sense signal. The sense circuit sinks the memory current from the data bit line when the controller operates in a reset operation and a reverse read operation.

In an embodiment of the resistive random-access memory device, the sense circuit applies a supply voltage to the source line when the controller operates in the reset operation and the reverse read operation, wherein a voltage across the selected RRAM cell is further clamped to a predetermined level when the controller operates in the reverse read operation.

In an embodiment of the resistive random-access memory device, the source line and the data bit line are shorted at the beginning and the supply voltage is then ramped up when the controller operates in the reset operation.

In an embodiment of the resistive random-access memory device, the sense circuit applies a ground level to the source line when the controller operates in a set operation and a forward read operation, and the memory current flows from the data bit line to the source line through the selected RRAM cell, wherein the voltage across the selected RRAM cell is further clamped to a predetermined level when the controller operates in the forward read operation.

In an embodiment of the resistive random-access memory device, the sense circuit includes a first current mirror, a first switch, a second current mirror, a second switch, and a comparator. The first current mirror copies the reference current of a first node with a first transfer ratio to a second node. The first switch couples the second node to the data bit line by a first operation signal generated by the controller. The second current mirror copies the memory current of the data bit line with a second transfer ratio to the second node. The second switch couples the second current mirror to the data bit line by a second operation signal generated by the controller. The first switch is ON and the second switch is OFF when the controller operates in the set operation and the forward read operation. The first switch is OFF and the second switch is ON when the controller operates in the reset operation and the reverse read operation. The comparator compares a first voltage of the first node with a second voltage of the second node to generate the sense signal.

In an embodiment of the resistive random-access memory device, the sense circuit further includes a third switch. The third switch couples the data bit line to either the source line or a third node by an enable signal generated by the controller. The third node is between the first switch and the second switch. When the controller operates in the set operation and the reset operation, the data bit line is coupled to the source line at the beginning and then the data bit line is coupled to the third node by the third switch.

In an embodiment of the resistive random-access memory device, the first switch is configured to clamp the voltage across the selected RRAM cell when the controller operates in the forward read operation, wherein the voltage of the first operation signal is configured to adjust the voltage across the selected RRAM cell.

In an embodiment of the resistive random-access memory device, the first switch is an N-type transistor when the memory current flows from the second node to the data bit line, wherein the first switch is a P-type transistor when the memory current flows from the data bit line to the second node.

In an embodiment of the resistive random-access memory device, the second switch is configured to clamp the voltage across the selected RRAM cell when the controller operates in the reverse read operation, wherein a voltage of the second operation signal is configured to adjust the voltage across the selected RRAM cell.

In an embodiment of the resistive random-access memory device, the second switch is a P-type transistor when the memory current flows from the data bit line to the second current mirror, wherein the second switch is an N-type transistor when the memory current flows from the second current mirror to the data bit line.

In an embodiment, a sense circuit is coupled to a data bit line of a RRAM unit storing a logic state. The RRAM unit is coupled between the data bit line and a source line. The sense circuit includes a first current mirror, a first switch, a second current mirror, a second switch, and a comparator. The first current mirror copies a reference current of a first node with a first transfer ratio to a second node and generating a first voltage at the first node according to the reference current. The first switch couples the second node to the data bit line by a first operation signal. The second current mirror copies a memory current flowing through the RRAM unit with a second transfer ratio to the second node to generate a second voltage at the second node. The second switch couples the second current mirror to the data bit line by a second operation signal. The first switch is OFF and the second switch is ON when the RRAM unit is operated in a reset operation and a reverse read operation. The comparator compares the first voltage with the second voltage to generate a sense signal. The sense circuit sinks the memory current from the data bit line when the RRAM unit is operated in the reset operation and the reverse read operation. The logic state is determined according to the sense signal.

In an embodiment of the sense circuit, the sense circuit applies a supply voltage to the source line of the RRAM unit when the RRAM unit is operated in the reset operation and the reverse read operation, wherein a voltage across the RRAM unit is further clamped to a predetermined level when the RRAM unit is operated in the reverse read operation.

In an embodiment of the sense circuit, the source line and the data bit line are shorted at the beginning and the supply voltage is then ramped up when the RRAM unit is operated in the reset operation.

In an embodiment of the sense circuit, the second switch is configured to clamp the voltage across the RRAM unit when the RRAM unit is operated in the reverse read operation, wherein a voltage of the second operation signal is configured to adjust the voltage across the selected RRAM unit.

In an embodiment of the sense circuit, the second switch is a P-type transistor when the memory current flows from the bit line to the second current mirror, wherein the second switch is an N-type transistor when the memory current flows from the second current mirror to the bit line.

In an embodiment of the sense circuit, the sense circuit applies a ground level to the source line when the RRAM unit is operated in a set operation and a forward read operation, and the memory current flows from the data bit line to the source line through the RRAM unit, wherein the voltage across the RRAM unit is clamped to a predetermined level when the RRAM unit is operated in the forward read operation.

In an embodiment of the sense circuit, the first switch is configured to clamp the voltage across the RRAM unit when the RRAM unit is operated in the forward read operation, wherein a voltage of the first operation signal is configured to adjust the voltage across the selected RRAM unit.

In an embodiment of the sense circuit, the first switch is an N-type transistor when the memory current flows from the second node to the data bit line, wherein the first switch is a P-type transistor when the memory current flows from the data bit line to the second node.

In an embodiment of the sense circuit, the sense circuit further includes a third switch. The third switch couples the source line to the data bit line or a third node according to an enable signal. The third node is between the first switch and the second switch. When the RRAM unit is operated in the set operation and the reset operation, the data bit line is coupled to the source line at the beginning and then the data bit line is coupled to the third node by the third switch.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
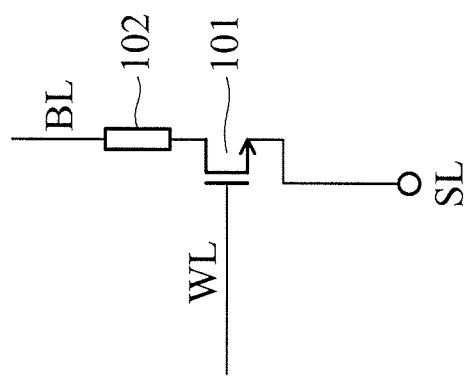
FIG. 1 is a block diagram of a RRAM unit in accordance with an embodiment of the invention.

FIG. 1 is a block diagram of a RRAM unit in accordance with an embodiment of the invention. As shown in FIG. 1, the RRAM unit 100 includes the transistor 101 and the RRAM cell 102, which is coupled between the bit line BL and the source line SL and selected by the word line WL. When the RRAM unit 100 operates in the forward read operation and the set operation, a positive bias is applied to the bit line BL, such that the memory current flows from the bit line BL to the source line SL through the RRAM cell 102. When the RRAM unit 100 operates in the reverse read operation and the reset operation, a positive bias is applied to the source line SL, such that the memory current flows from the source line SL to the bit line BL through the RRAM cell 102.

Figure 2:
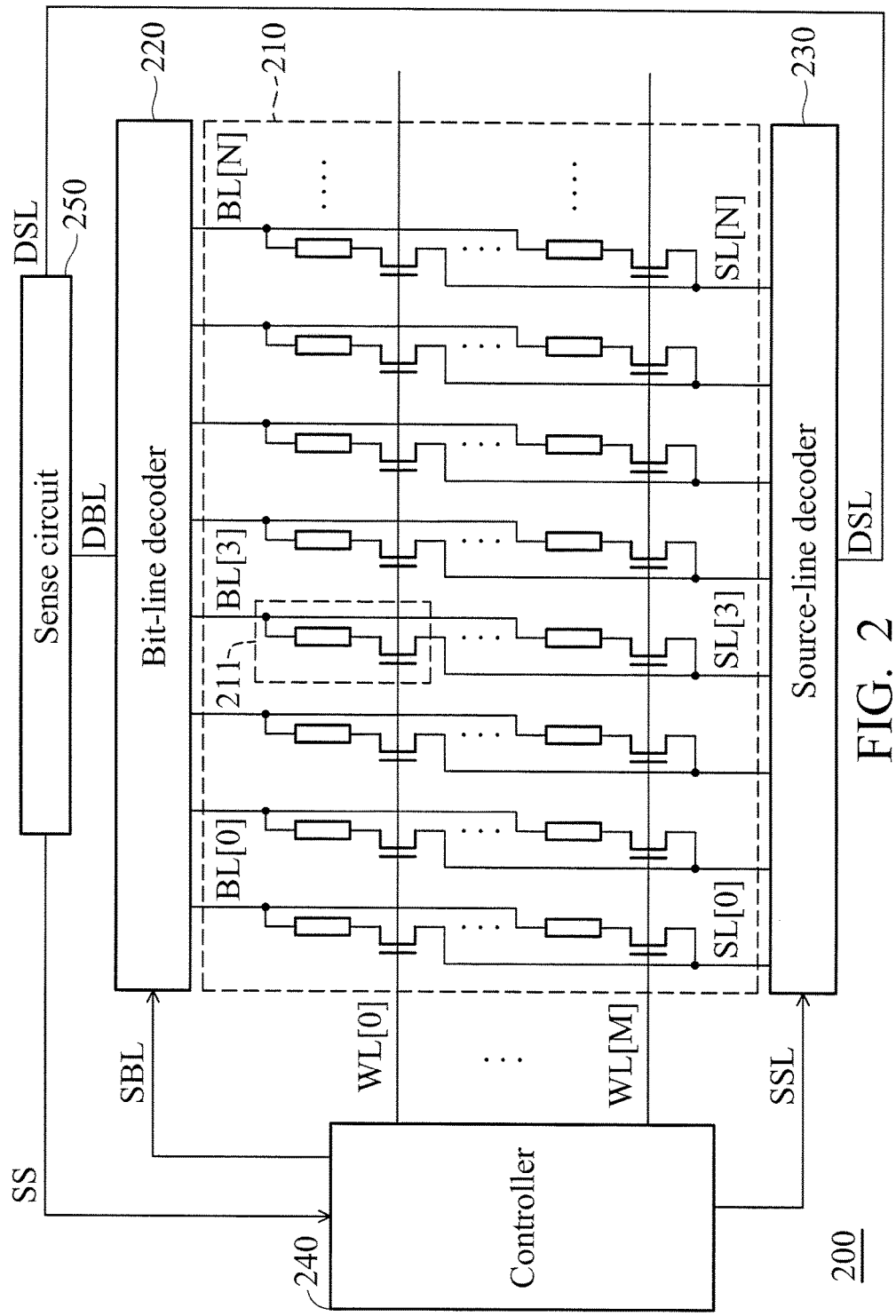
FIG. 2 is a block diagram of an embodiment of the compile module 23.

FIG. 2 is a block diagram of a resistive random-access memory device in accordance with an embodiment of the invention. As shown in FIG. 2, the RRAM device 200 includes the RRAM array 210, the bit-line decoder 220, the source-line decoder 230, the controller 240, and the sense circuit 250. The RRAM array 210 includes a plurality of RRAM cells, bit lines BL[0], BL[1], . . . , BL[N], N source lines SL[0], SL[1], . . . , SL[N], and M word lines WL[0], WL[1], . . . , WL[M].

The bit-line decoder 220 selects one of the bit lines BL[0], BL[1], . . . , BL[N] to be coupled to the data bit line DBL according to the bit-line signal SBL. According to an embodiment of the invention, the bit-line decoder 220 includes a plurality of Y-gates (not shown in FIG. 2), which are configured to select one of the bit lines BL[0], BL[1], . . . , BL[N] to be coupled to the data bit line DBL. The source-line decoder 230 selects one of the source lines SL[0], SL[1], . . . , SL[N] to be coupled to the data source line DSL according to the source-line signal SSL.

The controller 240 selects one of the word lines WL[0], WL[1], . . . , WL[M] and generates the bit-line signal SBL and the source-line signal SSL to select one of the RRAM cells in the RRAM array 210. According to an embodiment of the invention, when the selected RRAM cell 211 is selected, the controller 240 selects the word line WL[0] and provides the bit-line signal SBL for the bit-line decoder 220 to couple the bit line BL[3] to the data bit line DBL and the source-line signal SSL for the source-line decoder 230 to couple the source line SL[3] to the data source line DSL.

According to an embodiment of the invention, a Y-gate of the bit-line decoder 220 is turned on, according to the bit-line signal SBL, to couple the bit line BL[3] to the data bit line DBL. according to an embodiment of the invention, when the bit line BL[3] is coupled to the data bit line DBL, all the bit lines BL[0], BL[1], . . . , BL[N] except bit line BL[3] are tied to the ground level.

After the selected RRAM cell 211 is selected, the sense circuit 250 reads or writes the selected RRAM cell 211 through the data bit line DBL to generate the sense signal SS. The controller 240 determines the state of the logic state stored in the selected RRAM cell 211 according to the sense signal SS.

According to an embodiment of the invention, when the controller 240 operates in the forward read operation and the set operation, the sense circuit 250 provides a positive bias to the data bit line DBL and the ground level to the data source line DSL, and senses the memory current of the selected RRAM cell 211 from the data bit line DBL to generate the sense signal SS. According to another embodiment of the invention, when the controller 240 operates in the reverse read operation and the reset operation, the sense circuit 250 provides a positive bias to the data source line DSL and the ground level to the data bit line DBL, and senses the memory current of the selected RRAM cell 211 from the data source line DSL to generate the sense signal SS.

Since the sense circuit 250 has to sense the memory current from either the data bit line DBL or the data source line DSL, the complexity of the sense circuit 250 may have two sub-circuits to sense the memory current in either direction. Once the sense circuit 250 is able to source or sink the memory current, the complexity and the area of the sense circuit 250 should be greatly reduced.

Figure 3:
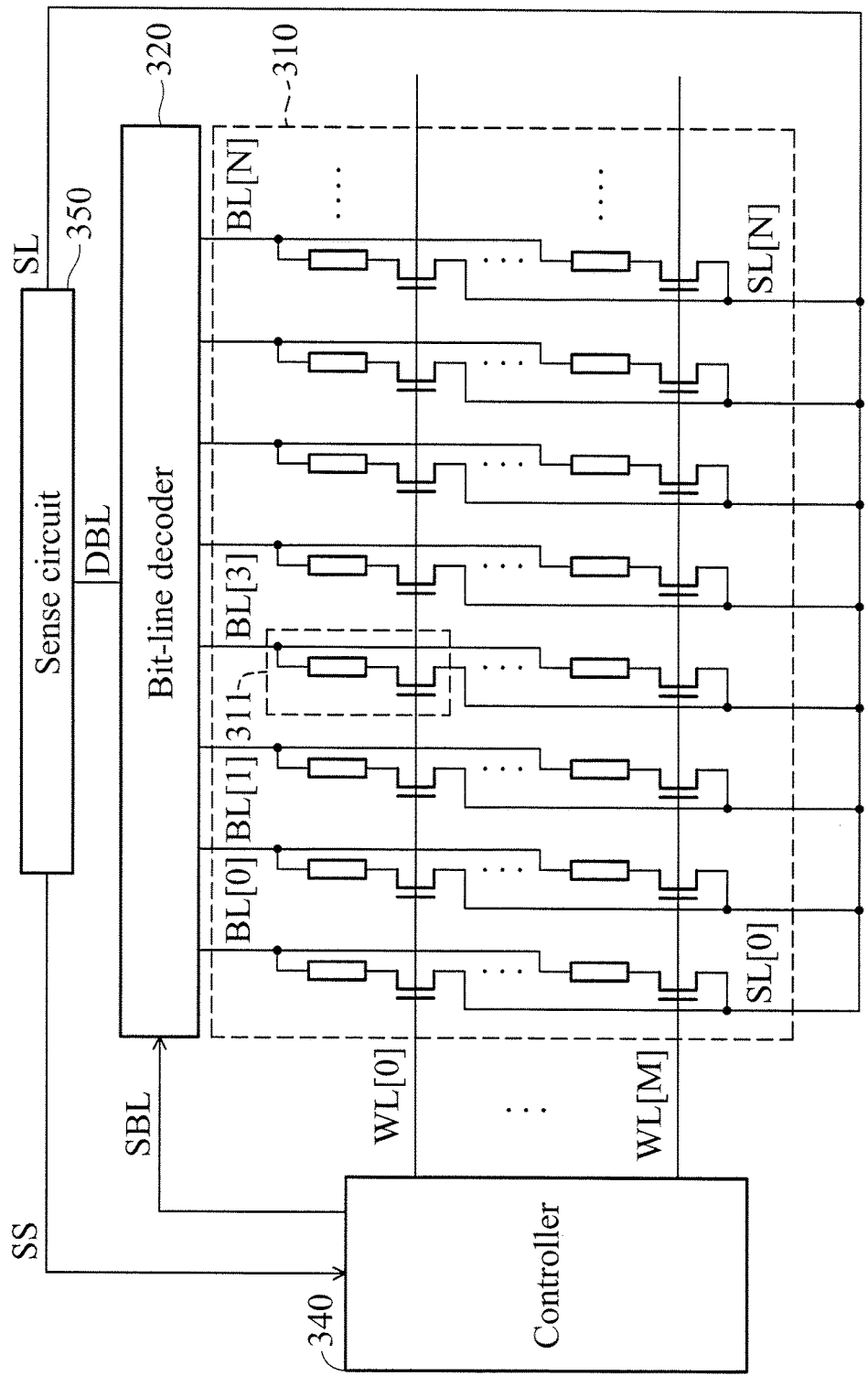
FIG. 3 is a block diagram of a resistive random-access memory device in accordance with another embodiment of the invention.

FIG. 3 is a block diagram of a resistive random-access memory device in accordance with another embodiment of the invention. As shown in FIG. 3, the RRAM device 300 includes the RRAM array 310, the bit-line decoder 320, the controller 340, and the sense circuit 350. Comparing FIG. 3 to FIG. 2, the difference is that the source lines SL[0], SL[1], . . . , SL[N] in FIG. 3 are all tied to the source line SL, such that the source line decoder 230 in FIG. 2 is no longer needed. Therefore, the sense circuit 350 is able to source and sink the memory current for sensing the selected RRAM cell 311. The sense circuit 350 will be described in detail in the following description.

Figure 4:
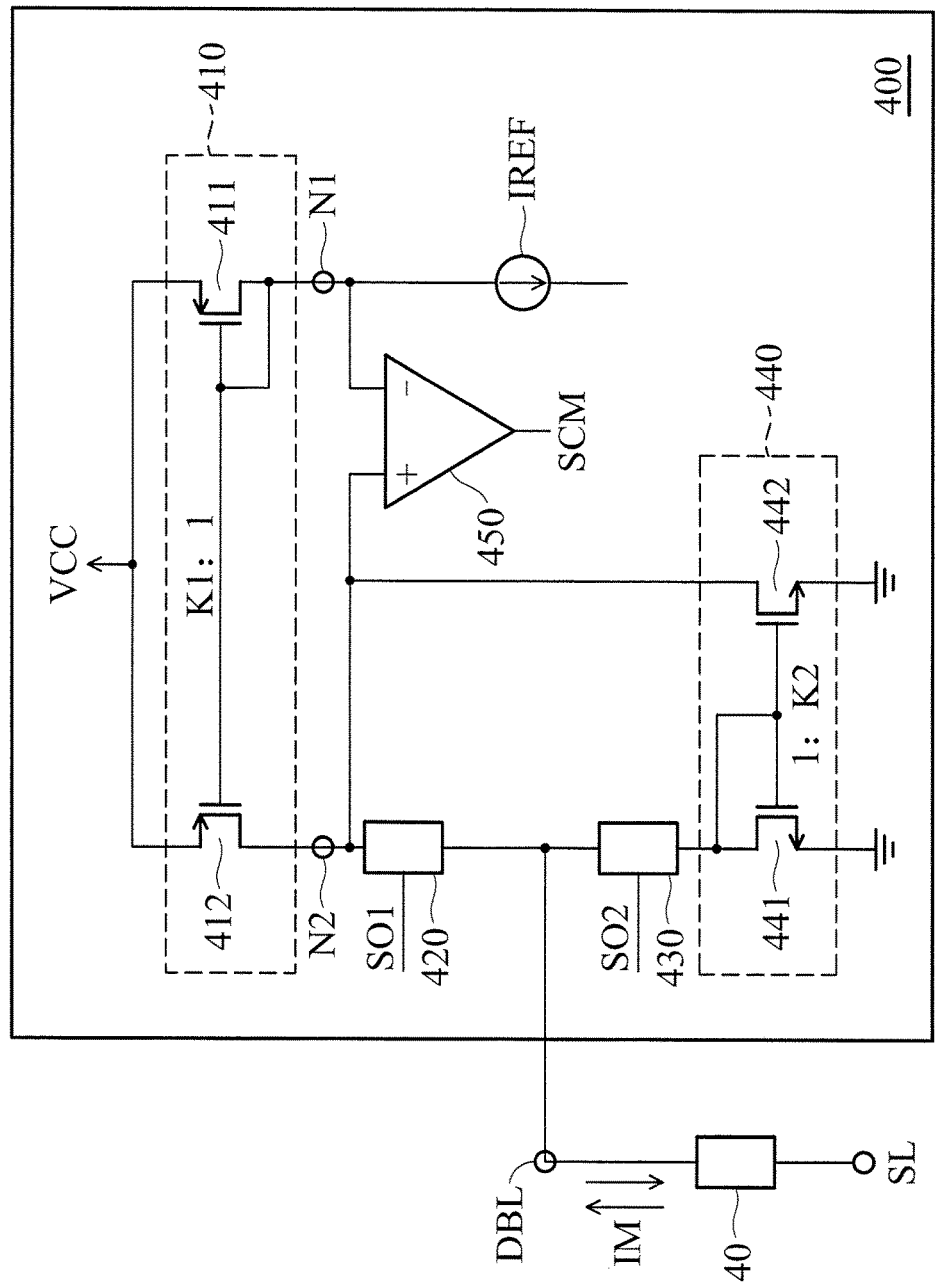
FIG. 4 is a schematic diagram of the sense circuit in FIG. 3 in accordance with an embodiment of the invention.

FIG. 4 is a schematic diagram of the sense circuit in FIG. 3 in accordance with an embodiment of the invention. As shown in FIG. 4, the sense circuit 400, which is coupled to the RRAM unit 40, includes the first current mirror 410, the first switch 420, the second switch 430, the second current mirror 440, and the comparator 450. According to an embodiment of the invention, the RRAM unit 40 includes a Y-gate of the bit-line decoder 320 in FIG. 3 and the RRAM cell 100 in FIG. 1.

According to the embodiment of the invention, the first current mirror 410 is a P-type current mirror, and the second current mirror 440 is an N-type current mirror. According to another embodiment of the invention, the first current mirror 410 is an N-type current mirror, and the second current mirror 440 is a P-type current mirror, and the sense current 400 should be modified accordingly. In the following description, the first current mirror 410 is illustrated as a P-type current mirror and the second current mirror 440 is illustrated as an N-type current mirror.

As shown in FIG. 4, the first current mirror 410, which includes the first P-type transistor 411 and the second P-type transistor 412, copies the reference current IREF of the first node N1 with a first transfer ratio K1 to the second node N2. The second node N2 is coupled to the data bit line DBL through the first switch 420 controlled by the first operation signal SO1.

According to an embodiment of the invention, the first switch 420 is configured to clamp the RRAM cell of the RRAM unit 40 in a predetermined level when the controller 340 in FIG. 3 operates in the forward read operation. According to the embodiment of the invention, the predetermined level is 0.2V. According to another embodiment of the invention, the first switch 420 is fully turned on when the controller 340 operates in the set operation.

The second current mirror 440, which includes the first N-type transistor 441 and the second N-type transistor 442, copies the memory current IM of the data bit line DBL with the second transfer ratio K2 to the second node N2. The first N-type transistor 441 of the second current mirror 440 is coupled to the data bit line DBL through the second switch 430 controlled by the second operation signal SO2.

According to an embodiment of the invention, the second switch 430 is configured to clamp the RRAM cell of the RRAM unit 40 in a predetermined level when the controller 340 in FIG. 3 operates in the reverse read operation. According to the embodiment of the invention, the predetermined level is 0.2V. According to another embodiment of the invention, the second switch 430 is fully turned on when the controller 340 operates in the reset operation.

For the simplicity of explanation, the first transfer ratio K1 and the second transfer ratio K2 are both 1 in the following description. According to another embodiment of the invention, the first transfer ratio K1 and the second transfer ratio K2 can be properly designed to have any value.

According to an embodiment of the invention, the first operation signal SO1 and the second operation signal SO2 are generated by the controller 340 in FIG. 3. According to an embodiment of the invention, when the controller 340 operates in the forward read operation and the set operation, the controller 340 generates the first operation signal SO1 to turn ON the first switch 420 and the second operation signal SO2 to turn OFF the second switch 430, such that the first current mirror 410 provides the supply voltage VCC to the RRAM unit 40 (i.e., the first transfer ratio K1 is assumed to be 1).

According to another embodiment of the invention, when the controller 340 operates in the reverse read operation and the reset operation, the controller 340 generates the first operation signal SO1 to turn OFF the first switch 420 and the second operation signal SO2 to turn ON the second switch 430, such that the memory current IM of the RRAM unit 40 is sunk into the first N-type transistor 441 of the second current mirror 440. The second current mirror 440 then sinks the memory current IM from the second node N2 (i.e., the second transfer ratio K2 is assumed to be 1).

The comparator 450 compares the voltage of the first node N1 to the voltage of the second node N2 to generate the sense signal SCM. The controller 340 in FIG. 3 determines the logic state stored in the RRAM unit 40 according to the sense signal SCM. According to the embodiment of the invention, when the voltage of second node N2 exceeds the voltage of the first node N1, the sense signal SCM is in the high logic state; when the voltage of the second node N2 does not exceed the voltage of the first node N1, the sense signal SCM is in the low logic state.

According to another embodiment of the invention, the comparator 350 can be accordingly designed to generate the sense signal SCM in the high logic state when the voltage of the first node N1 exceeds that of the second node N2.

According to an embodiment of the invention, when the controller 340 operates in the forward read operation, the sense circuit 400 provides the ground level to the source line SL (not shown in FIG. 4). The controller 340 further generates the first operation signal SO1 and the second operation signal SO2 to turn ON the first switch 420 and to turn OFF the second switch 430. Therefore, the first current mirror 410 provides the supply voltage VCC to the data bit line DBL, and the memory current IM flows from the data bit line DBL to the source line SL.

Once the memory current IM exceeds the reference current IREF flowing through the second P-type transistor 412 (i.e., the first transfer ratio K1 is assumed to be 1), the voltage of the second node N2 is pulled low. The comparator 450 compares the voltage of first node N1 with the voltage of the second node N2 to generate the sense signal SCM in the low logic state. Therefore, the controller 340 determines that the logic state stored in the RRAM unit 40 is in the low logic state, since the sense signal SCM is in the low logic state.

On the other hand, the memory current IM is less than the reference current IREF, such that the voltage of the second node N2 is pulled high and exceeds the voltage of the first node N1. After comparing the voltage of the first node N1 to the voltage of the second node N2 to generate the sense signal SCM, the controller 340 is able to determine that the logic state stored in the RRAM unit 40 is in the high logic state.

According to another embodiment of the invention, when the controller 340 operates in the reverse read operation, the sense circuit 400 provides the supply voltage VCC to the source line SL (not shown in FIG. 4). The controller 340 further generates the first operation signal SO1 and the second operation signal SO2 to turn OFF the first switch 420 and to turn ON the second switch 430. Therefore, the second current mirror 440 sinks the memory current IM from the data bit line DBL and copies the memory current IM to the second node N2 (i.e., the second transfer ratio K2 is assumed to be 1).

Since the current direction of the memory current IM in the reverse read operation is transferred by the second current mirror 440, the sense circuit 400 is able to sense the logic state stored in the RRAM unit 40 when the memory current IM flows in either direction.

Figure 5:
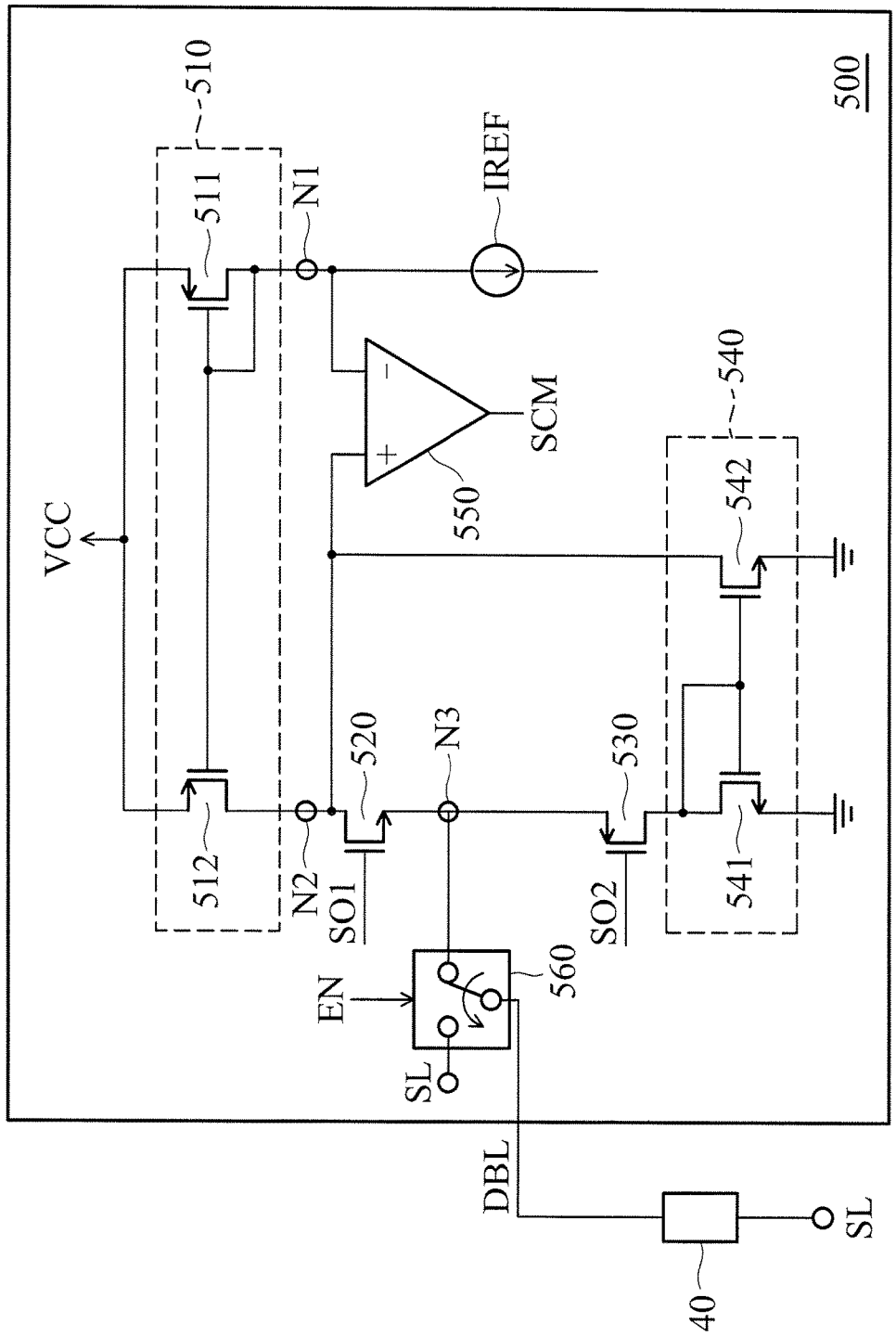
FIG. 5 is a schematic diagram of the sense circuit in FIG. 3 in accordance with another embodiment of the invention.

FIG. 5 is a schematic diagram of the sense circuit in FIG. 3 in accordance with another embodiment of the invention. As shown in FIG. 5, the sense circuit 500 is identical to the sense circuit 400 in FIG. 4, except the N-type switch 520, the P-type switch 530, and the third switch 560. Comparing FIG. 5 with FIG. 4, the first switch 420 is replaced by the N-type switch 520, and the second switch 430 is replaced by the P-type switch 530. According to another embodiment of the invention, the first switch 420 in FIG. 4 is replaced by a P-type switch and the second switch 430 is replaced by an N-type switch, when the first current mirror 410 is N-type and the second current mirror 440 is P-type.

The third switch 560 couples the data bit line DBL to either the source line SL or the third node N3 by the enable signal EN generated by the controller 340 in FIG. 3. According to an embodiment of the invention, when the controller 340 in FIG. 3 operates in the set operation and the reset operation, the controller 340 generates the enable signal EN to couple the source line SL to the data bit line DBL, so that the RRAM unit 40 is protected from any disoperation.

According to an embodiment of the invention, when the controller 340 operates in the set operation, the sense circuit 500 provides the ground level to the source line SL (not shown in FIG. 5), and the data bit line DBL is initially coupled to the source line SL through the third switch 560 controlled by the enable signal EN.

Once the data bit line DBL is coupled to the third node N3 by the third switch 560 controlled by the enable signal EN, the second P-type transistor 512 provides the supply voltage VCC to the data bit line DBL, and the N-type switch 520 is fully turned on instead of clamping the voltage of the third node N3. According to an embodiment of the invention, the voltage of the first operation signal SO1 is configured to adjust the voltage across the RRAM unit 40.

On the other hand, when the controller 340 operates in the reset operation, the data bit line DBL is also initially coupled to the source line SL through the third switch 560 controlled by the enable signal EN, and the sense circuit 500 provides the supply voltage VCC to the source line SL.

Once the data bit line DBL is coupled to the third node N3 by the third switch 560, the first N-type transistor 541 couples the data bit line DBL to the ground, and the P-type switch 530 is fully turned on instead of clamping the voltage of the third node N3. According to an embodiment of the invention, the voltage of the second operation signal SO2 is configured to adjust the voltage across the RRAM unit 40. According to an embodiment of the invention, the supply voltage VCC is ramped up to protect the RRAM unit from any disoperation.

The sense circuits in FIGS. 4 and 5 are proposed. Since the proposed sense circuit could either source or sink the memory current IM, there is no need for the sense circuit to switch between the data bit line and the data source line to sense the selected RRAM cell, such that both the read operation and the write operation of a RRAM device could be more efficient with the proposed sense circuit. In addition, the source-line decoder could be omitted for reducing the area of the RRAM device.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A resistive random-access memory device, comprising:
   a RRAM array, comprising:
      a plurality of RRAM units coupled to a source line, wherein each of the RRAM unit is selected by a corresponding bit line and a corresponding word line, wherein each of the RRAM units comprises:
         a RRAM cell, coupled to the corresponding bit line and storing a logic state; and
         a transistor, coupled between the RRAM cell and the source line and controlled by the corresponding word line;
   a controller, selecting a selected RRAM cell by a bit-line signal and a selected word line, wherein the controller determines the logic state stored in the selected RRAM cell according to a sense signal;
   a bit-line decoder, directly coupling a data bit line to the selected bit line according to a hit-line signal; and
   a sense circuit, directly coupled to the data bit line and comparing a memory current flowing through the selected RRAM with a reference current to generate the sense signal, wherein the sense circuit sinks the memory current from the data bit line when the controller operates in a reset operation and a reverse read operation, wherein the sense circuit comprises:

a first current mirror, copying the reference current of a first node with a first transfer ratio to a second node;

a first switch, coupling the second node to the data bit line by a first operation signal generated by the controller;

a second current mirror, copying the memory current of the data bit line with a second transfer ratio to the second node;

a second switch, coupling the second current mirror to the data bit line by a second operation signal generated by the controller, wherein the first switch is ON and the second switch is OFF when the controller operates in a set operation and a forward read operation, wherein the first switch is OFF and the second switch is ON when the controller operates in the reset operation and the reverse read operation; and a comparator, comparing a first voltage of the first node with a second voltage of the second node to generate the sense signal.

2. The resistive random-access memory device of claim 1, wherein the sense circuit applies a supply voltage to the source line when the controller operates in the reset operation and the reverse read operation, wherein a voltage across the selected RRAM cell is further clamped to a predetermined level when the controller operates in the reverse read operation.

3. The resistive random-access memory device of claim 2, wherein the source line and the data bit line are shorted at the beginning and the supply voltage is then ramped up when the controller operates in the reset operation.

4. The resistive random-access memory device of claim 2, wherein the sense circuit applies a ground level to the source line when the controller operates in the set operation and the forward read operation, and the memory current flows from the data bit line to the source line through the selected RRAM cell, wherein the voltage across the selected RRAM cell is further clamped to a predetermined level when the controller operates in the forward read operation.

5. The resistive random-access memory device of claim 1, wherein the sense circuit further comprises:

a third switch, coupling the data bit line to either the source line or a third node by an enable signal generated by the controller, wherein the third node is between the first switch and the second switch, wherein, when the controller operates in the set operation and the reset operation, the data bit line is coupled to the source line at the beginning and then the data bit line is coupled to the third node by the third switch.

6. The resistive random-access memory device of claim 1, wherein the first switch is configured to clamp the voltage across the selected RRAM cell when the controller operates in the forward read operation, wherein a voltage of the first operation signal is configured to adjust the voltage across the selected RRAM cell.

7. The resistive random-access memory device of claim 6, wherein the first switch is an N-type transistor when the memory current flows from the second node to the data bit line, wherein the first switch is a P-type transistor when the memory current flows from the data bit line to the second node.

8. The resistive random-access memory device of claim 1, wherein the second switch is configured to clamp the voltage across the selected RRAM cell when the controller operates in the reverse read operation, wherein a voltage of the second operation signal is configured to adjust the voltage across the selected RRAM cell.

9. The resistive random-access memory device of claim 8, wherein the second switch is a P-type transistor when the memory current flows from the data bit line to the second current mirror, wherein the second switch is an N-type transistor when the memory current flows from the second current mirror to the data bit line.

10. A sense circuit directly coupled to a data bit line of a RRAM unit storing a logic state, wherein the RRAM unit is coupled between the data bit line and a source line, wherein the RRAM unit comprises a RRAM cell coupled to the data bit line and a transistor coupled between the RRAM cell and the source line, comprising:

a first current mirror, copying a reference current of a first node with a first transfer ratio to a second node and generating a first voltage at the first node according to the reference current;

a first switch, coupling the second node to the data bit line by a first operation signal;

a second current mirror, copying a memory current flowing through the RRAM unit with a second transfer ratio to the second node to generate a second voltage at the second node;

a second switch, coupling the second current mirror to the data bit line by a second operation signal, wherein the first switch is OFF and the second switch is ON when the RRAM unit is operated in a reset operation and a reverse read operation; and a comparator, comparing the first voltage with the second voltage to generate a sense signal, wherein the sense circuit sinks the memory current from the data bit line when the RRAM unit is operated in the reset operation and the reverse read operation, wherein the logic state is determined according to the sense signal.

11. The sense circuit in claim 10, wherein the sense circuit applies a supply voltage to the source line of the RRAM unit when the RRAM unit is operated in the reset operation and the reverse read operation, wherein a voltage across the RRAM unit is further clamped to a predetermined level when the RRAM unit is operated in the reverse read operation.

12. The sense circuit in claim 11, wherein the source line and the data bit line are shorted at the beginning and the supply voltage is then ramped up when the RRAM unit is operated in the reset operation.

13. The sense circuit of claim 11, wherein the second switch is configured to clamp the voltage across the RRAM unit when the RRAM unit is operated in the reverse read operation, wherein a voltage of the second operation signal is configured to adjust the voltage across the selected RRAM unit.

14. The sense circuit of claim 13, wherein the second switch is a P-type transistor when the memory current flows from the bit line to the second current mirror, wherein the second switch is an N-type transistor when the memory current flows from the second current mirror to the bit line.

15. The sense circuit of claim 11, wherein the sense circuit applies a ground level to the source line when the RRAM unit is operated in a set operation and a forward read operation, and the memory current flows from the data bit line to the source line through the RRAM unit, wherein the voltage across the RRAM unit is clamped to a predetermined level when the RRAM unit is operated in the forward read operation.

16. The sense circuit of claim 15, wherein the first switch is configured to clamp the voltage across the RRAM unit when the RRAM unit is operated in the forward read operation, wherein a voltage of the first operation signal is configured to adjust the voltage across the selected RRAM unit.

17. The sense circuit of claim 16, wherein the first switch is an N-type transistor when the memory current flows from the second node to the data bit line, wherein the first switch is a P-type transistor when the memory current flows from the data bit line to the second node.

18. The sense circuit of claim 15, further comprising:
a third switch, coupling the source line to the data bit line or a third node according to an enable signal, wherein the third node is between the first switch and the second switch, wherein, when the RRAM unit is operated in the set operation and the reset operation, the data bit line is coupled to the source line at the beginning and then the data bit line is coupled to the third node by the third switch.

* * * * *